(12) United States Patent
Ishii et al.

(10) Patent No.: US 12,077,427 B2
(45) Date of Patent: Sep. 3, 2024

(54) MEMS DISPLAY DEVICE WITH A VERTICAL HINGE

(71) Applicants: IGNITE, Inc., Tokyo (JP); Fusao Ishii, Pittsburgh, PA (US); Victor Stone, Pittsburgh, PA (US); Toshitaka Torikai, Kanagawa (JP)

(72) Inventors: Fusao Ishii, Pittsburgh, PA (US); Victor Stone, Pittsburgh, PA (US); Toshitaka Torikai, Kanagawa (JP)

(73) Assignee: IGNITE, Inc., Minato-Ku Tokyo (JP)

( * ) Notice: Subject to any disclaimer, the term of this patent is extended or adjusted under 35 U.S.C. 154(b) by 581 days.

(21) Appl. No.: 17/280,941

(22) PCT Filed: Sep. 29, 2019

(86) PCT No.: PCT/US2019/053713
§ 371 (c)(1),
(2) Date: Mar. 29, 2021

(87) PCT Pub. No.: WO2020/069482
PCT Pub. Date: Apr. 2, 2020

(65) Prior Publication Data
US 2021/0340005 A1    Nov. 4, 2021

Related U.S. Application Data

(60) Provisional application No. 62/739,175, filed on Sep. 29, 2018.

(51) Int. Cl.
*B81B 3/00* (2006.01)
*G02B 26/08* (2006.01)

(52) U.S. Cl.
CPC .......... *B81B 3/0051* (2013.01); *B81B 3/0021* (2013.01); *G02B 26/0841* (2013.01); *B81B 2201/042* (2013.01)

(58) Field of Classification Search
CPC ................ B81B 3/0051; B81B 3/0021; B81B 2201/042; G02B 26/0841
(Continued)

(56) References Cited

U.S. PATENT DOCUMENTS 6,922,272 B1    7/2005   de Groot et al.
7,183,618 B2    2/2007   Ishii
(Continued)

FOREIGN PATENT DOCUMENTS

| CN | 101088037 A | 12/2007 | |
|---|---|---|---|
| CN | 106054376 A | 10/2016 | |
| WO | WO-2014168658 A1 * | 10/2014 | ......... G02B 26/0841 |

*Primary Examiner* — William Choi
(74) *Attorney, Agent, or Firm* — Young Basile Hanlon & MacFarlane, P.C.

(57) ABSTRACT

A micro-electro-mechanical systems device includes a substrate, each of an electronic circuit, an etch stop layer, and a hinge base mounted on the substrate, and an electrode connected to the circuit. A hinge is mounted on the base and is made of a doped semiconductor. The hinge includes a vertical support that extends vertically from the base, and a horizontally-extending hinge tab contacts the vertical support. The device also includes a movable mirror and a mirror via that couples the mirror to the hinge tab. The mirror is electrostatically attracted to the electrode responsive to application of a voltage between the electrode and the mirror, and movement of the mirror changes a relative position between the hinge tab and the vertical support. A stopper is mounted on the substrate that mechanically stops the movement of the mirror before the mirror contacts the electrode or etch stop layer.

27 Claims, 9 Drawing Sheets

(58) Field of Classification Search
USPC ....... 359/212.1, 223.1, 224.1, 290, 291, 295
See application file for complete search history.

(56) References Cited

U.S. PATENT DOCUMENTS

| | | | |
|---|---|---|---|
| 7,746,538 B2* | 6/2010 | Ishii | G02B 26/0841 |
| | | | 359/290 |
| 8,331,010 B2 | 12/2012 | Ishii | |
| 2010/0033800 A1 | 2/2010 | Ishii | |
| 2010/0046062 A1* | 2/2010 | Maeda | H04N 5/7458 |
| | | | 359/291 |
| 2016/0073920 A1 | 3/2016 | Kassegne et al. | |
| 2018/0162724 A1 | 6/2018 | Tripathi et al. | |

* cited by examiner

MEMS DISPLAY DEVICE WITH A VERTICAL HINGE

CROSS-REFERENCE TO RELATED APPLICATIONS

This application claims priority to and the benefit of U.S. Provisional Application Patent Ser. No. 62/739,175, filed Sep. 29, 2018, the entire disclosure of which is hereby incorporated by reference. This application is related to U.S. Pat. Nos. 7,183,618 and 8,331,010, each of which is incorporated herein in its entirety by reference.

TECHNICAL FIELD

This disclosure relates to a micro-electro-mechanical systems (MEMS) display device having a vertical hinge supporting a movable mirror.

BACKGROUND

A MEMS device used in a display can have a vertical hinge to support a mirror switched between an ON position and an OFF position. A vertical hinge with precise positioning is desirable.

BRIEF SUMMARY

A MEMS device includes a substrate, an electronic circuit mounted on the substrate, and an electrode electrically connected to the electronic circuit. The MEMS device also includes an etch stop layer mounted on the substrate, a hinge base mounted on the substrate, and a hinge mounted on the hinge base. The hinge includes a vertical support that extends vertically from the hinge base and a horizontally-extending hinge tab in contact with the vertical support, wherein the hinge is made of a doped semiconductor. The MEMS device also includes a movable mirror and a mirror via that couples the movable mirror to the hinge tab. The movable mirror is electrostatically attracted to the electrode responsive to application of a voltage between the electrode and the movable mirror, and movement of the movable mirror changes a relative position between the hinge tab and the vertical support. The MEMS device includes a stopper mounted on the substrate that mechanically stops the movement of the movable mirror before contact with one of the electrode or the etch stop layer. More specifically, the hinge tab can be configured to contact the stopper to mechanically stop the movement of the movable mirror before contact with one of the electrode or the etch stop layer. The doped semiconductor may be in-situ amorphous silicon.

Details of this implementation, and variations in this and other implementations of the teachings herein are described below with reference to the drawing figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

MEMS devices according to the teachings herein include a vertical hinge (or simply a hinge) formed for precise positioning of a mirror supported thereon during operation. The mirror is generally parallel to the surface of the substrate when in the OFF position, and is tilted until contact with a stopper, which constitutes the ON position. The hinge is a vertical hinge including components such as a foot in addition to a vertical support and one or more hinge tabs formed of doped amorphous silicon. In some implementations, a hinge tab has a barrier metal and is devoid of an oxidation layer or a nitride layer. These components may be simultaneously deposited as a single deposition of a doped semiconductor such as an in-situ doped amorphous silicon with phosphate or arsenate. The vertical support is a made as a side wall of a hole. The gap between the stopper and the hinge tab is determined by a thickness of a sacrificial layer, which is accurately controlled by deposition. No etching or chemical mechanical polishing (CMP) is required, which makes accurate control of thickness difficult. The resulting gap allows precise control of the tilt angle of the mirror in the ON position. Further, the residual stress of the hinge determines the neutral angle, which is the angle of mirror without voltage relative to the substrate surface. The residual stress can be controlled from a compressive to a tensile condition based on the silicon deposition recipe. Accordingly, the residual stress of the hinge herein is such that the neutral position corresponds to the OFF position being generally parallel to the surface of the substrate.

Due to the strength of the hinge described herein, a MEMS display device incorporating such a hinge can endure high temperatures during operation. The hinge has a relatively small form factor as compared with alternative horizontal hinge structures.

Figure 1:
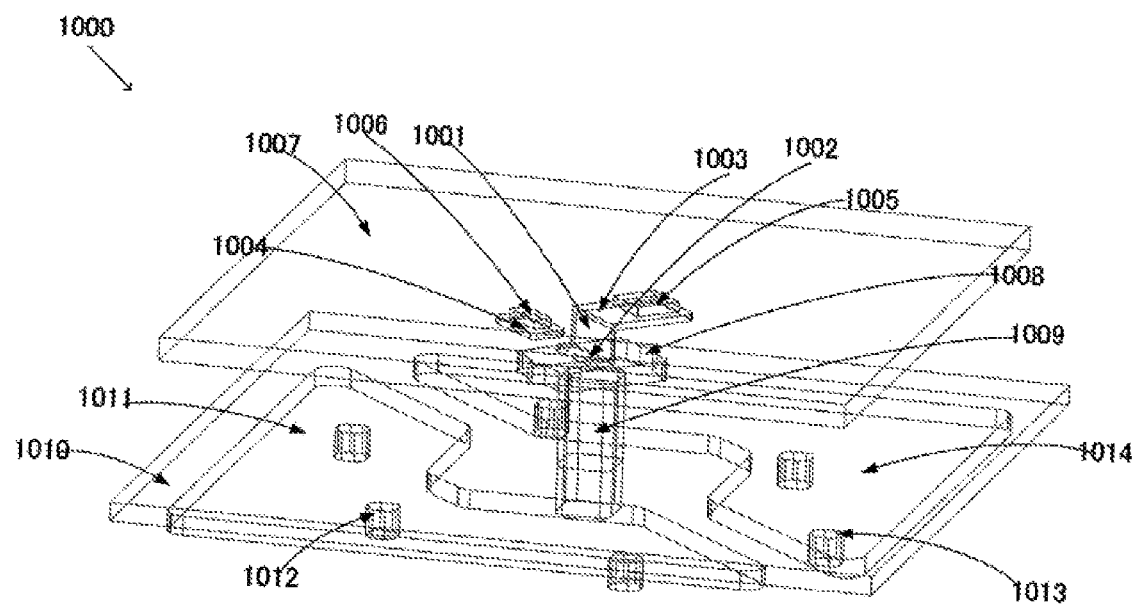
FIG. 1 is a perspective view of a MEMS device according to a first implementation of the teachings herein.
Figure 2:
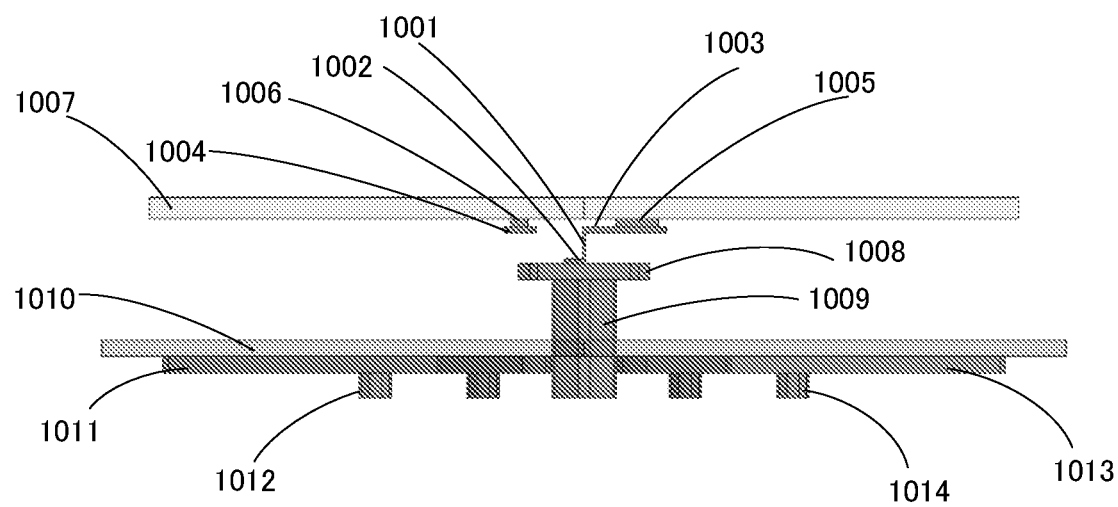
FIG. 2 is a side view of the MEMS device of FIG. 1 in an OFF position.
Figure 3:
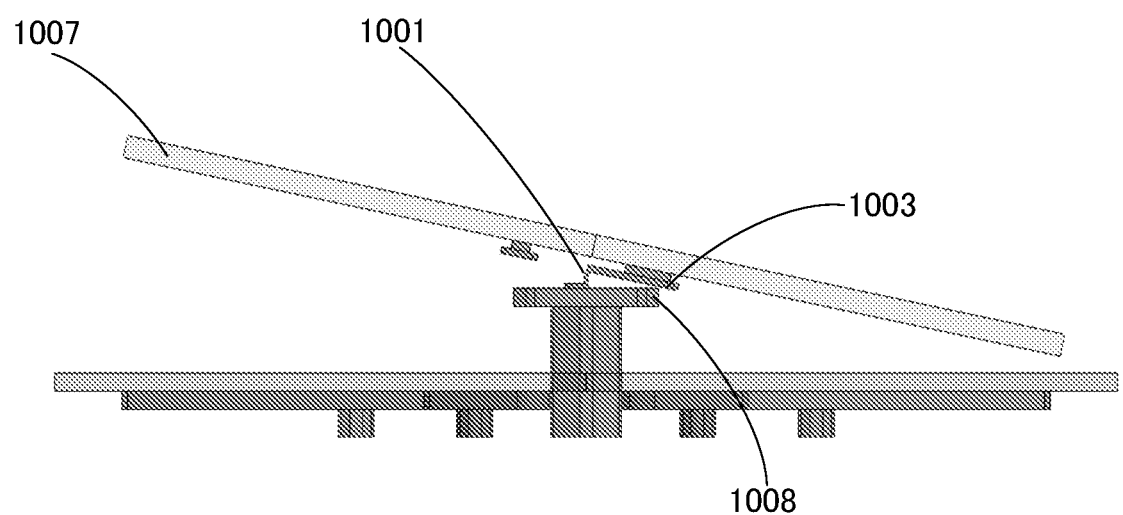
FIG. 3 is a side view of the MEMS device of FIG. 1 in an ON position.

A MEMS device 1000 according to a first implementation of the teachings herein is described with reference to FIGS. 1 to 3. These figures show only certain components of the MEMS device 1000 so as not to obscure the details of the hinge, and because there exist many available variations in the arrangement of the MEMS device 1000. A more detailed description of components that may form the MEMS device 1000 is described with reference to FIG. 16.

Figure 16:
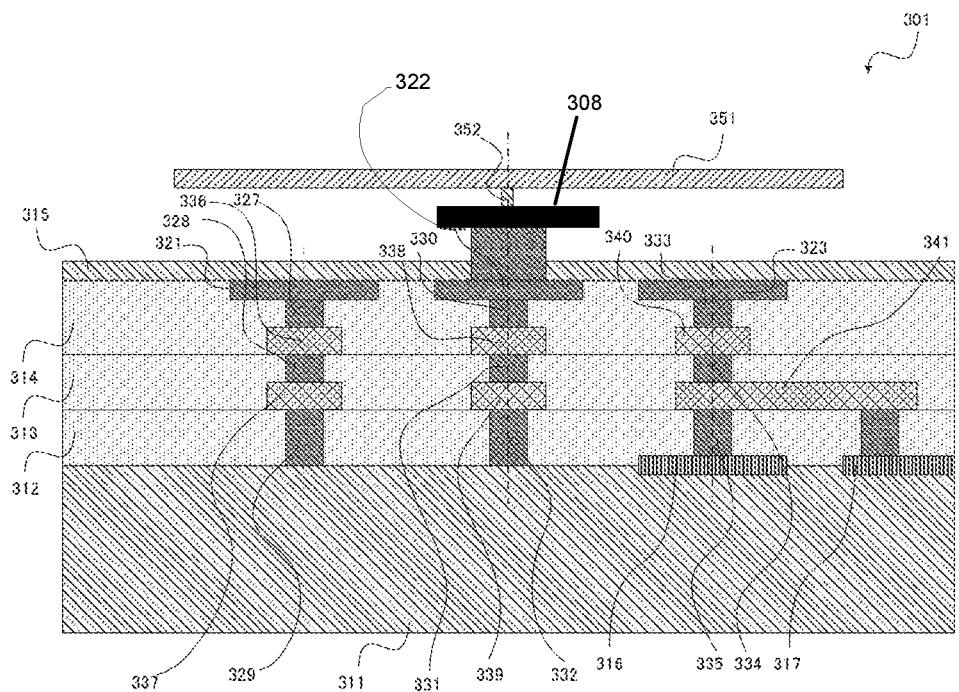
FIG. 16 is a cross-sectional diagram used to explain the detailed construction of an example of a MEMS device according to the teachings herein.

Referring now to FIG. 16, the MEMS device 301 includes a substrate 311. At least the surface of the substrate may comprise aluminum nitride (AlN), alumina ($Al_2SO_3$), Silicon or hafnium oxide ($HfO_2$). One or more electronic circuits is formed on the substrate 311, which in this example is one or more transistors 316, 317. Inter-layer dielectrics 312, 313, 314 are formed on the substrate 311. Namely, the inter-layer dielectric 312 is formed on the substrate 311 and portions of the electronic circuits, here the transistors 316, 317. The inter-layer dielectric 313 is formed on the inter-layer dielectric 312, and the inter-layer dielectric 314 is formed on the inter-layer dielectric 313. More or fewer inter-layer dielectrics may be incorporated. An inter-layer dielectric may also be referred to herein as an insulating layer.

An etch stop layer 315 formed as the top layer. Electrodes 321, 322, 323 are composed of Copper (Cu), Aluminum (Al), tungsten (W), or the like. The electrodes 321, 322, 323 may be formed by a damascene process so as to be buried (e.g., embedded) in the inter-layer dielectric 314. The electrodes 321, 322, 323 and the inter-layer dielectric 314 may be simultaneously subjected to CMP, and they are aligned on the same surface. The etch stop layer 315 is formed on the electrodes 321, 322, 323 and the inter-layer dielectric 314, and is planarized on the same surface.

The MEMS device 301 has metal layers 336, 337, 338, 339, 340, 341 and the electrodes 321, 322, 323 for electrical wiring between the inter-layer dielectrics 312, 313, 314. Also, the MEMS device 301 has vias 327, 328, 329, 330, 331, 331, 332, 333, 334, 335 connecting electrical wirings and electrodes. More generally, the MEMS device 301 can include one or more electrodes embedded within the inter-layer dielectric 314 for electrical connection with the one or more electronic circuits of the MEMS device 301 through metal layers and vias insulated using the inter-layer dielectrics. The number of electrodes, metal layers, and vias of a MEMS device according to the teachings herein can vary based on the electronic circuits within the MEMS device 301 and their arrangements therein.

As shown in FIG. 16, the via 327 provides a conductive path through the inter-layer dielectric 314 from the electrode 321 to the metal layer 336, which is formed on the inter-layer dielectric 313. The via 328 provides a conductive path through the inter-layer dielectric 313 from the metal layer 336, which is formed on the inter-layer dielectric 313, to the metal layer 337, which is formed on the inter-layer dielectric 312. The via 329 provides a conductive path through the inter-layer dielectric 312 from the metal layer 337, which is formed on the inter-layer dielectric 312, to the substrate 311. Through the vias 327, 328, 329 and the metal layers 336, 337, the electrode 321 may be electrically wired or connected to electronic circuits with contacts or conductive traces on the substrate 311, the inter-layer dielectric 312, and the inter-layer dielectric 313.

In a similar manner, the via 330 provides a conductive path through the inter-layer dielectric 314 from the electrode 322, which is embedded within the inter-layer dielectric 314, to the metal layer 338, which is formed on the inter-layer dielectric 313. The via 331 provides a conductive path through the inter-layer dielectric 313 from the metal layer 338, which is formed on the inter-layer dielectric 313, to the metal layer 339, which is formed on the inter-layer dielectric 312. The via 332 provides a conductive path through the inter-layer dielectric 312 from the metal layer 339, which is formed on the inter-layer dielectric 312, to the substrate 311. Through the vias 330, 331, 332 and the metal layers 338, 339, the electrode 322 may be electrically wired or connected to electronic circuits with contacts of conductive traces on the substrate 311, the inter-layer dielectric 312, and the inter-layer dielectric 313.

Connections of an electrode with an electronic circuit are shown in FIG. 16 with reference to the connection of the electrode 323 to contacts for one or more transistors 316, 317. The via 333 provides a conductive path through the inter-layer dielectric 314 from the electrode 323, which is embedded within the inter-layer dielectric 314, to the metal layer 340, which is formed on the inter-layer dielectric 313. The via 334 provides a conductive path through the inter-layer dielectric 313 from the metal layer 340, which is formed on the inter-layer dielectric 313, to the metal layer 341, which is formed on the inter-layer dielectric 312. The vias 335 provide respective conductive paths through the inter-layer dielectric 312 from the metal layer 341, which is formed on the inter-layer dielectric 312, to the contacts of the one or more transistors 316, 317 mounted on the substrate 311. Through the vias 333, 334, 335 and the metal layers 340, 341, the electrode 323 may also be electrically wired or connected to electronic circuits with conductive traces or contacts on the inter-layer dielectric 312 and the inter-layer dielectric 313.

Further, the MEMS device 301 has a hinge 352 formed on the electrode 322 directly or on an additional conductive support structure mounted on the electrode 322, where the conductive support as shown in each of the figures by example may be formed of the same material as the electrode 322. The MEMS device 301 has a mirror element 351 formed on the upper side of the hinge 352. In this example, the mirror element 351 (also called a mirror herein) is a movable element that may be incorporated into the MEMS device. Meanwhile, a mechanical stopper 308 is formed at the bottom of the hinge 352. The mechanical stopper 308 as shown is a single piece formed of the same material as the hinge 352 that extends in parallel with the default or unexcited position of the mirror element 351, which is in turn in parallel with a mounting surface of the substrate 311 and its layers.

The substrate 311 may be composed of single crystal silicon, or some other substrate material. The transistors 316 and 317 are Complementary metal-oxide-semiconductor (CMOS) transistors in this example, but other electronic circuits are possible. The inter-layer dielectrics 312, 313, 314 are interlayer insulating films or layers including silicon dioxide ($SiO_2$) or another appropriate insulating material.

The metal layers 336, 337, 338, 339, 340, 341 are made of, for example, aluminum (Al), copper (Cu), or an aluminum copper alloy (Al—Cu).

The electrodes 321, 322, 323 are made of tungsten (W) or the same material as the vias. Each of the vias 327, 328, 329, 330, 331, 332, 333, 334, 335 is formed as a through-hole that extends through at least one layer of the MEMS device 301 and is filled with a conductive material, W in this example.

The hinge 352 is a deformable member that supports the mirror element 351. Different implementations of the hinge 352 are discussed below in more detail.

The mirror element 351 is a member capable of reflecting light from light sources. The mirror element 351 has a support layer composed of titanium (Ti), W, or the like, and a mirror layer composed of a material with good reflectivity, such as Al, gold (Au), or silver (Ag), or any combination thereof.

The mirror element 351 is electrostatically attracted to the electrode 323, and the hinge 352 tilts due to deformation into an ON position of the mirror element 351. This may result from applying a voltage between the mirror element 351 and the electrode 323 by the electronic circuit formed on the substrate 311 (e.g., the transistors 316, 317) and a voltage source generally mounted elsewhere and electrically coupled to (e.g., traces and/or connectors of) the MEMS device 301. The voltage causes the attractive force. The mirror element 351 is prevented from contact with the etch stop layer 315, by contacting the stopper 308. That is, the mechanical stopper 308 is mounted at a height above the electrodes 321, 323 and has a size (e.g., a length) sufficient to prevent deformation of the hinge 352 from causing the mirror element 351 to contact the surface above the electrode 323. For example, the length of the mechanical stopper 308 allows contact with the mirror element 351 when the mirror element 351 tilts to prevent the mirror element 351 from contacting another other portion of the MEMS device. Thus, it is possible to prevent an electrical short circuit. Absent the application of a voltage, the hinge 352 returns to the OFF position of the mirror element 351 shown in FIG. 16.

Referring again to FIGS. 1 to 3, further details of the hinge and its connection to the mirror are shown with only the top layers of the MEMS device 1000. The perspective view of FIG. 1 shows these top layers in outline only so as to better see those details, while the side views in FIG. 2 (the OFF position) and FIG. 3 (the ON position) are also limited to these top layers. Specifically, these figures show a hinge (comprising a vertical support 1001, a hinge foot 1002, and hinge tabs 1003, 1004), mirror vias 1005, 1006, a mirror 1007, a stopper 1008, a hinge support 1009, an etch stop layer 1010, electrodes 1011, 1013, and vias 1012, 1014.

The mirror 1007 may have the same structure as the mirror element 351. The stopper may have the same structure as the stopper 308. The etch stop layer 1010 may have the same structure as the etch stop layer 315. The electrode 1011 may have the same structure as the electrode 321, and the electrode 1013 may have the same structure as the electrode 323. The vias 1012, 1014 may have the same structure as the vias 327, 333. The vias 1012, 1014 may have the same structure as the vias 327, 333. The via 1012 may have the same structure as the via 327, and the via 1014 may have the same structure as the via 333. The hinge support 1009 may have the same structure as described with regards to the additional conductive support structure mounted on the electrode 322.

The mirror vias 1005, 1006 and the hinge support 1009 support the hinge. More specifically, the hinge includes the hinge foot 1002 that is formed on the hinge support 1009, and the vertical support 1001 that extends generally vertically from the hinge foot 1002. The hinge tab 1003 extends radially from the top of the vertical support 1001 in the direction opposite from the hinge foot 1002. The hinge tab 1003 is secured to the mirror 1007 by the mirror via 1005. The hinge tab 1004 is secured to the mirror 1007 by the mirror via 1006. The hinge foot 1002, the hinge tab 1003, and the hinge tab 1004 are generally aligned (e.g., centered) along the same radial line. Next, the general formation of the hinge is described.

First, when the electrodes 1011, 1013 are made of W, for example, a damascene or dual damascene process is more suitable than etching. An oxide layer is patterned and etched to create holes having the shape of the electrodes, and tungsten is deposited by a chemical vapor deposition (CVD). The resulting surface is polished by a CMP. In case of dual damascene, the vias 1012, 1014, which may also be formed of W, and the electrodes 1011, 1013 are deposited simultaneously. Both the hinge support 1009 and the stopper 1008 can be made with another dual damascene process. Subsequently, the hinge is formed on the stopper 1008. Where the stopper 1008 is not present, i.e., one or more stoppers are located elsewhere on the MEMS substrate, such as the MEMS substrate 311, the hinge may be formed on the hinge support 1009. This can be explained with reference to FIGS. 12 to 15.

Figure 12:
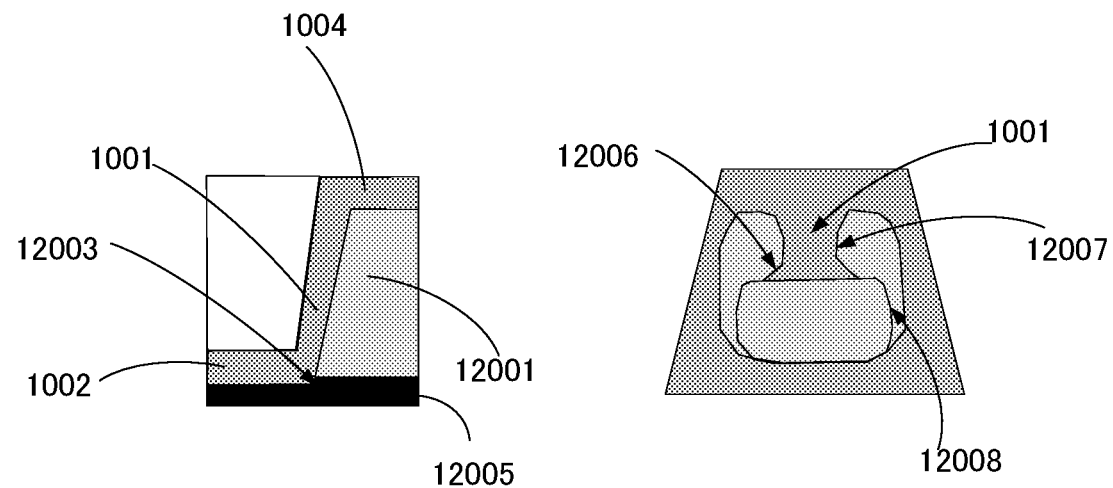
FIG. 12 is two different views of a hinge according to the teachings herein.

Referring first to FIG. 12, depositing an oxide layer 12001 over a base 12005 (e.g., by CVD), a hole can be etched whose bottom reaches the surface of the hinge base 12005. The hinge base 12005 can be the stopper 1008 or the hinge support 1009 when a stopper is located other than on the hinge support 1009. Desirably, the hole is a square hole. The surface is flattened by a CMP. Amorphous silicon is then deposited (e.g., by CVD), covering the side wall of the hole. The residual stress of the hinge can be controlled by adjusting the recipe of the silicon deposition (e.g., the amount of doping) from a compressive to a tensile condition for the final hinge. Then, a photo-resist layer is coated and patterned by lithography to etch-off the three sides of side walls of the hole leaving only one side wall to form the vertical support 1001 and the hinge tabs 1003, 1004. In this manner, components of the hinge (in this example the vertical support 1001, the hinge foot 1002, and the hinge tabs 1003, 1004) are simultaneously deposited as a single deposition of in-situ doped amorphous silicon with phosphate or arsenate. The thickness of the vertical support 1001 may be from 100 A to 1000 A, inclusive. A resistance of the vertical support 1001 may be from 5 Mohm to 1 Gohm, inclusive. A thermal coefficient of the resistance of the vertical support 1001 may be negative such that a higher a temperature of the hinge, the lower a resistance of the hinge.

The height of the vertical support 1001 is dictated by the depth of the hole, whose depth is determined by CVD deposition of the sacrificial oxide layer 12001. This allows precise control because no CMP or etching, which can make depth control difficult, is involved. The precise control of the height of the vertical support 1001 controls the gap between the stopper and the hinge tab 1004, which determines the tilt angle of the mirror 1007. Control of the tilt angle of the mirror 1007 is important because it represents the ON position of the MEMS device, and can affect the appearance of a resulting display device incorporating the MEMS device.

After deposition and etching of the amorphous silicon, the mirror vias 1005, 1006 can be formed of a material, such as W, that has a good adhesion to the silicon hinge. The material may be or include at least a material having a Vickers hardness exceeding 500 MPaness. A damascene process may be used. One or more optional Ti and/or titanium nitride (TiN) layers may be used as a barrier metal before depositing W to help to improve the adhesion of W to silicon, Al, or both. This may result in a mirror via being encapsulated by barrier metals including Titanium, Titanium Nitride, or a combination thereof. The mirror vias 1005, 1006 also help to avoid the migration or diffusion of the material of the mirror 1007, such as Al, into the amorphous silicon. The migration of Al degrades the strength of amorphous silicon. A vertical height of the mirror vias 1005, 1006 may be less than 0.5 microns. The mirror vias 1005, 1006 may be round or square in cross-section (e.g., a round horizontal shape or a square horizontal shape).

Aluminum can then be deposited over the mirror vias 1005, 1006, and the mirror pattern is etched to form the mirror 1007. A tilt angle of the mirror after removal of the sacrificial layer used in the etching is within +/−0.5 degrees of a desired tilt angle (e.g., based on the contact with the stopper) by adjusting at least one of the flow rate of silane used for etching, a temperature of the substrate, or a pressure inside a CVD chamber used for deposition of the aluminum. A distance between the mirror 1007 and the etch stop layer 1010 may be less than 3 microns, where the etch stop layer 1010 is located above the electrodes 1011, 1013.

As a result of these steps, the mirror vias 1005, 1006, and the mirror 1007 are electrically connected by a conductive material enabling electrical resistance between the mirror 1007 and the hinge to be less than 10 G ohms. One or both of the mirror vias 1005, 1006 may have rounded corners with a turn radius of less that 50% of a width of the mirror via. A distance between the hinge base, such as the stopper 1008, and a hinge tab, such as the hinge tab 1003, may be less than one-half a distance between the vertical support 1001 and an edge of the mirror 1007.

In the hinge formed as described above, a surface adhesion of the hinge foot to the hinge base may exceed a shear force of the hinge in a vertical direction. A surface adhesion of the mirror via to a surface of the hinge tab may exceed the shear force of the hinge in the vertical direction. A surface adhesion of the mirror via to a surface of the mirror may exceed the shear force of the hinge in the vertical direction. A surface tension of the vertical support adjacent to the hinge tab and a surface tension of the vertical support adjacent to the hinge base may differ by more than 1%.

In the hinge of FIG. 12, the vertical support 1001 is thicker at the top or upper portion (i.e., in the region of the hinge tab 1004) than the bottom of the vertical support 1001 in the area of the heel 12003 of the hinge (also called a hinge heel). This can contribute to avoiding a shift in the center of rotation of the hinge during changes between the ON and OFF positions. Also, the width of the hinge is such that the top or upper portion is narrower than the area around the heel 12003. This can increase the strength of hinge and the adhesion of hinge (e.g., the hinge foot 1002) to the base 12005 (e.g., the stopper 1008 or the hinge support 1009). While the hinge of FIG. 12 has both a thicker upper area and a wider bottom area, a hinge according to the disclosure herein may have only one of these attributes. A hinge according to the disclosure may taper from a top adjacent to a hinge tab to a bottom adjacent to a hinge base.

Figure 13:
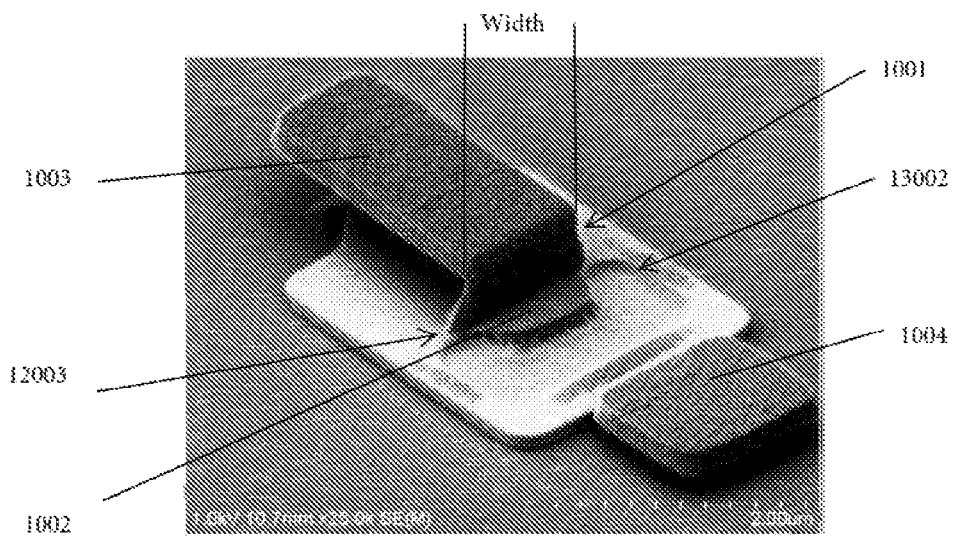
FIG. 13 is a photo of a hinge according to a first variation.

The photograph in FIG. 13 shows a hinge having the fluting effect wherein the width of the bottom of the hinge (e.g., at the heel 12003) is greater than the width of the top. In conjunction with the layering described above, the variation of FIG. 13 shows a fence 13002 that may result from the lithography step. When present, the fence 13002 contributes to the height of the hinge in the vertical direction. Desirably, the height of the fence 13002, or at least that portion forming adjoining the residual walls of the hinge material, is not larger than 20% of the vertical height of hinge as measured from the base 12005 to the top surface of the vertical support 1001 (and hence of the hinge tab 1003).

Figure 14:
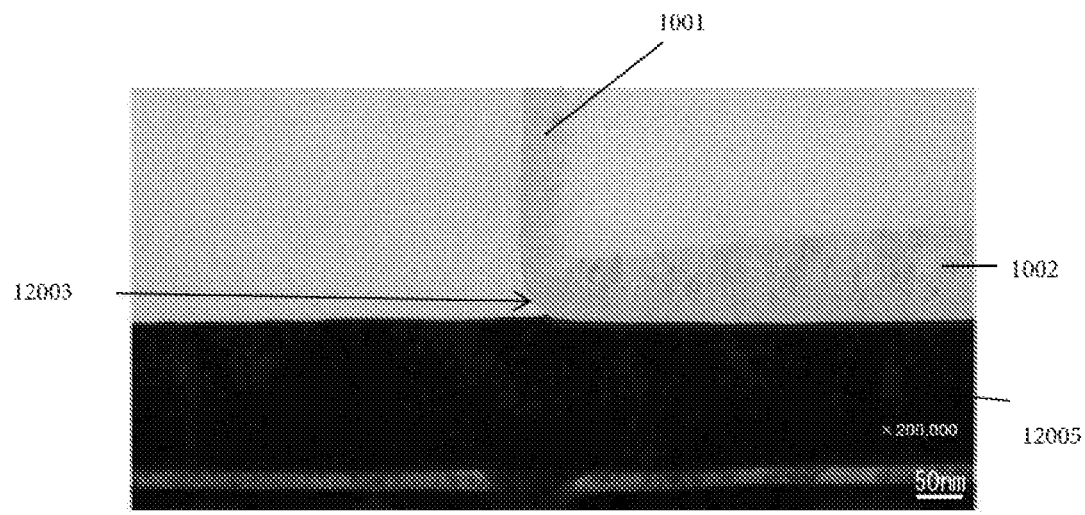
FIG. 14 is a photo of hinge according to a second variation.
Figure 15:
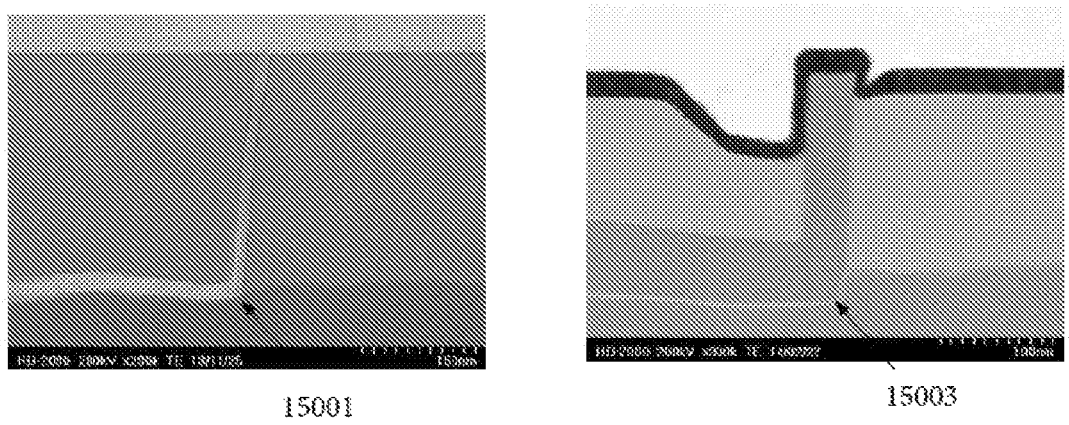
FIG. 15 is a photo of hinge according to a third variation.

Another variation in the construction of the hinge is shown in FIG. 14. In the photo of FIG. 14, the heel 12003 of the hinge foot 1002 is curved in a side view where the hinge foot and the vertical support meet. A curved heel, as compared to a heel with a substantially perpendicular outline (e.g., a heel 15001 having a sharp corner as shown in FIG. 15), increases the strength of the hinge. By increasing the strength, this disclosure means increasing the number of ON-OFF cycles that the hinge can perform without failure.

As one example, failure can occur where the hinge no longer returns to the OFF position after removal of a voltage source.

Regardless of the shape of the heel, the heel 15003 may be buried in (e.g., sunk into) the base 12005 as shown in FIG. 15. That is, the (e.g., square) hole may be etched into the surface of the base 12005 such that, when the amorphous silicon is applied, the silicon layer is above the surface of the base 12005. As a result, a bottom surface of the hinge foot may be below a top surface of the hinge base. This increases the strength of the hinge over a heel, such as the heel 15001, that is mounted on the surface of the base 12005. In an example where the heel 15003 is further rounded, further increases in hinge strength would result.

In the MEMS device formed using a hinge according to any of these variations, a contact point of the stopper with the mirror may be horizontal and rounded with a turn radius less than 25% of a longest dimension of the stopper. The contact point of the stopper with the mirror may have a tilt angle of less than 100 degrees in a side view of the MEMS device, such as shown in FIG. 3. A resting angle of the hinge tab 1003 relative the vertical support 1001 is from 80 to 90 degrees, inclusive, with respect to the surface of the substrate, such as the substrate 311, such as shown in FIG. 2. Thus, the OFF position occurs where the mirror 1007 is horizontal or substantially horizontal to the substrate surface.

Figure 4:
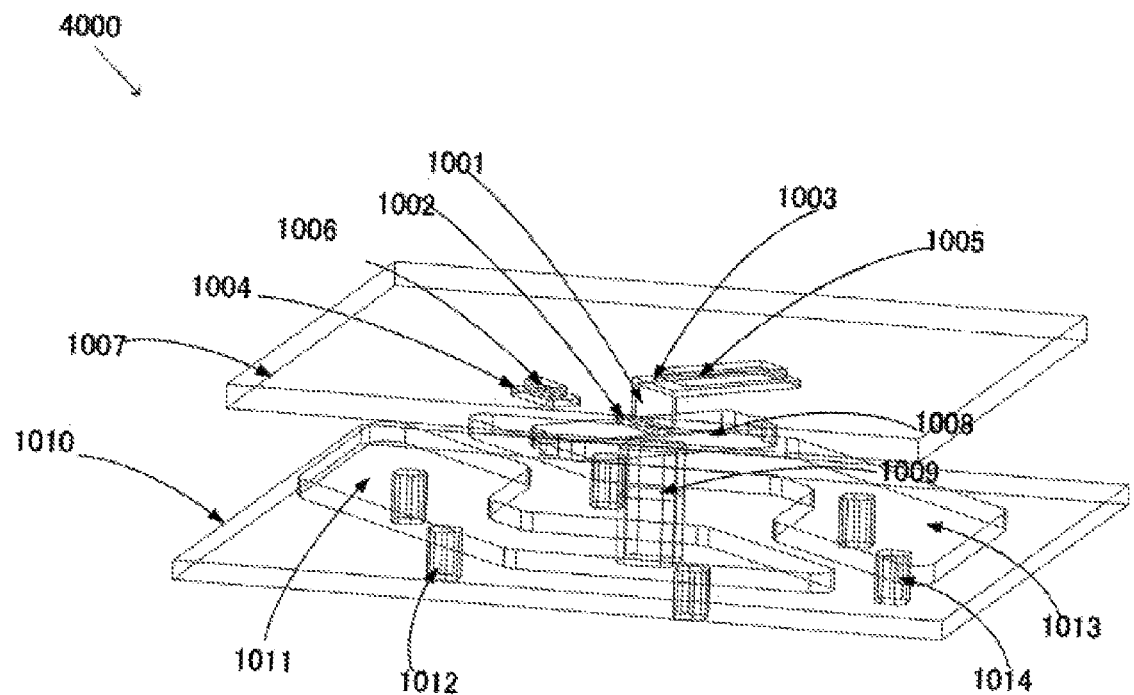
FIG. 4 is a perspective view of a MEMS device according to a second implementation of the teachings herein.
Figure 5:
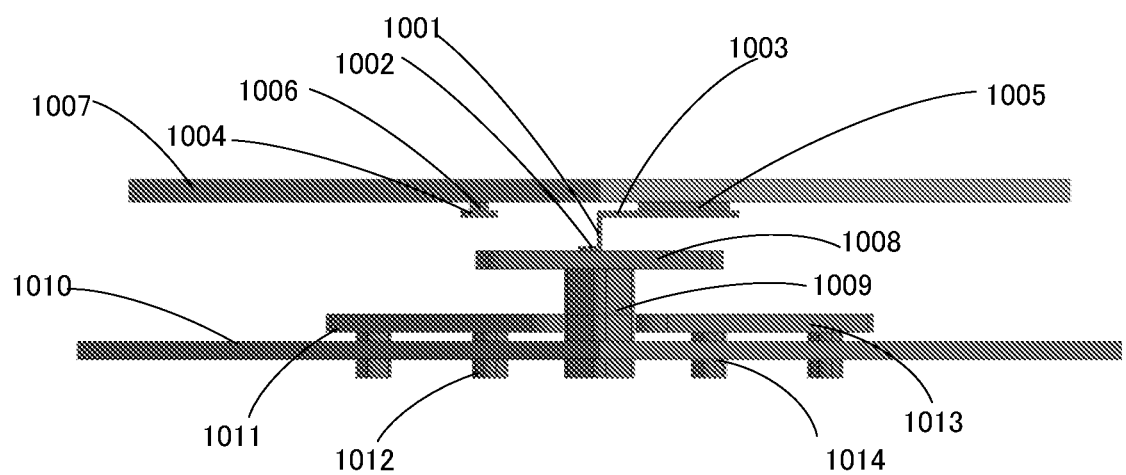
FIG. 5 is a side view of the MEMS device of FIG. 4 in an OFF position.

FIG. 4 is a perspective view of a MEMS device 4000 according to a second implementation of the teachings herein, and FIG. 5 is a side view of the MEMS device 4000 in the OFF position. The structure of the MEMS device 4000 is substantially similar to the structure of the MEMS device 1000. The only differences are related to the electrodes and the etch stop layer. In the MEMS device 1000, the etch stop layer 1010 is above and in contact with the electrodes 1011, 1013. In the MEMS device 4000, the etch stop layer 1010 is below the electrodes 1011, 1013. As can be seen more clearly in FIG. 5, the electrodes 1011, 1013 are separated from the etch stop layer 1010 by one or more inter-layer dielectrics that may be similar to the inter-layer dielectrics 312, 313, 314. This structure requires more process steps that the manufacturing process described with regards to the structure of the MEMS device 1000. However, the driving voltage for controlling the movement of the mirror 1007 in the MEMS device 4000 can be lower than that in the MEMS device 1000.

Figure 6:
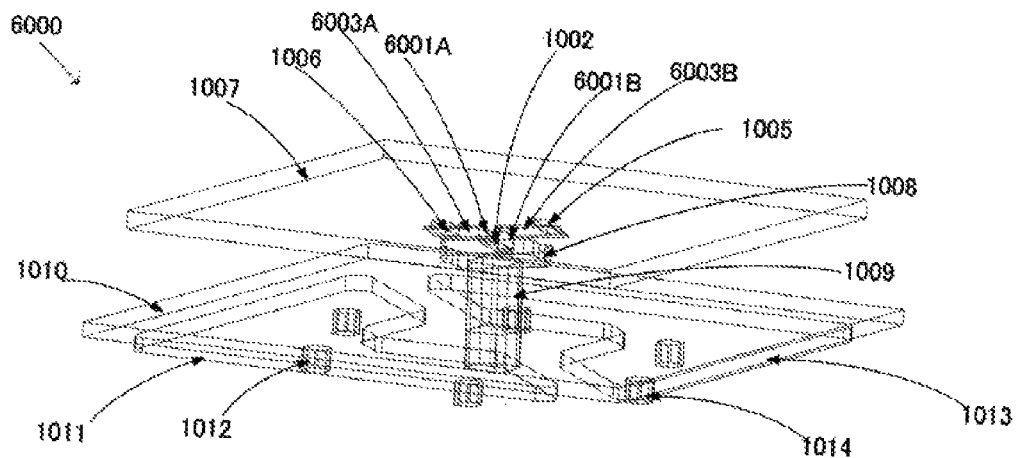
FIG. 6 is a perspective view of a MEMS device according to a third implementation of the teachings herein.
Figure 7:
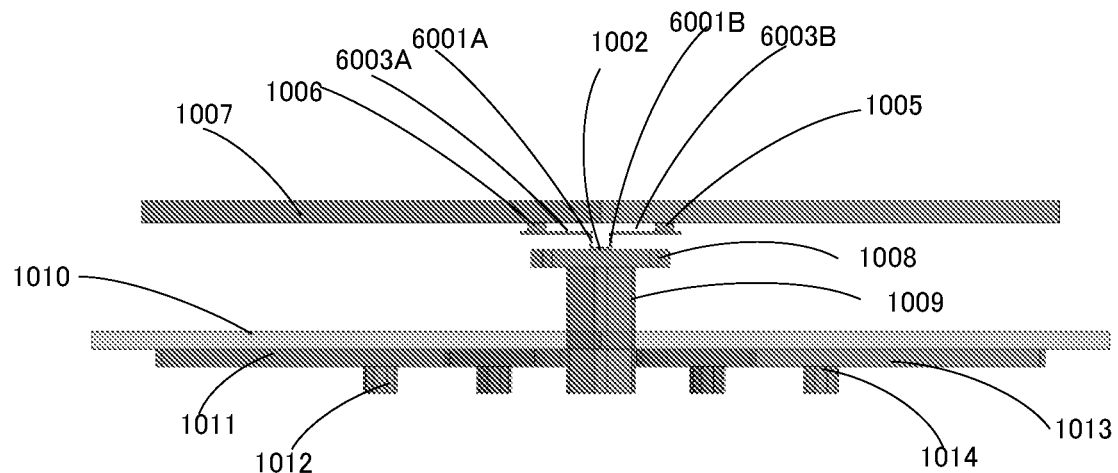
FIG. 7 is a side view of the MEMS device of FIG. 6 in an OFF position.

FIG. 6 is a perspective view of a MEMS device 6000 according to a third implementation of the teachings herein, and FIG. 7 is a side view of the MEMS device 6000 in the OFF position. The structure of the MEMS device 6000 is substantially similar to the structure of the MEMS device 1000. The only differences are related to the structure of the hinge. The hinge in the MEMS device 6000 includes two vertical supports 6001A, 6001B extending vertically upwards from opposite sides of a common foot 1002. The vertical supports 6001A, 6001B may be referred to as duel vertical supports herein. A hinge tab 6003A extends radially away from the top of the vertical support 6001A, and the hinge tab 6003B extends radially away from the top of the vertical support 6001B. The hinge tabs 6003A, 6003B extend along the same radial line, and may be referred to as duel horizontal tabs herein. The mirror 1007 is secured to the hinge tab 6003A through the mirror via 1006, and the mirror 1007 is secured to the hinge tab 6003B through the mirror via 1005.

The vertical hinge comprising the foot 1002, the vertical supports 6001A, 6001B, and the hinge tabs 6003A, 6003B are formed similarly to the foot 1002, the vertical support 1001, and the hinge tab 1003. That is, after deposition of the oxide layer 12001, and etching of a hole to the base 12005, a deposition of in-situ doped amorphous silicon occurs (e.g., using CVD) over the hole, the side walls, and the top surface of the oxide layer 12001. Then, a photo-resist layer is coated and patterned by lithography. While the hinge of the MEMS device 1000 is formed by etching-off the three sides of the side walls, the hinge of the MEMS device 6000 is formed by etching-off only opposing sides of the side walls of the hole. Subsequently, the mirror vias 1005, 1006 and the mirror 1007 may be formed as described above.

The vertical hinge of the MEMS device 6000 may incorporate any of the variations described with regards to FIGS. 12 to 15. This structure for a hinge, and any of its variations, may be incorporated with MEMS devices using different layered arrangements, such as with the MEMS device 4000 of FIGS. 4 and 5.

Figure 8:
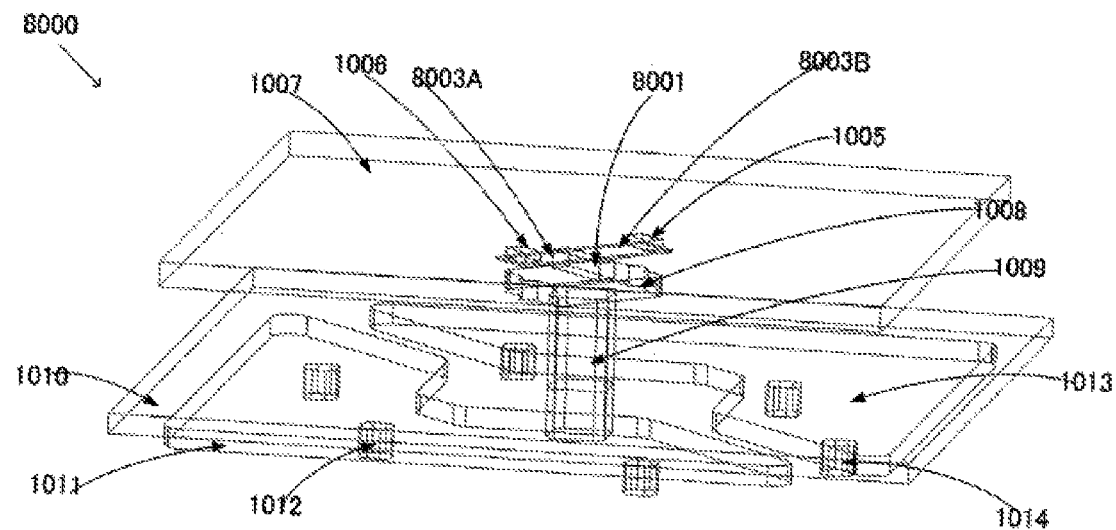
FIG. 8 is a perspective view of a MEMS device according to a fourth implementation of the teachings herein.
Figure 9:
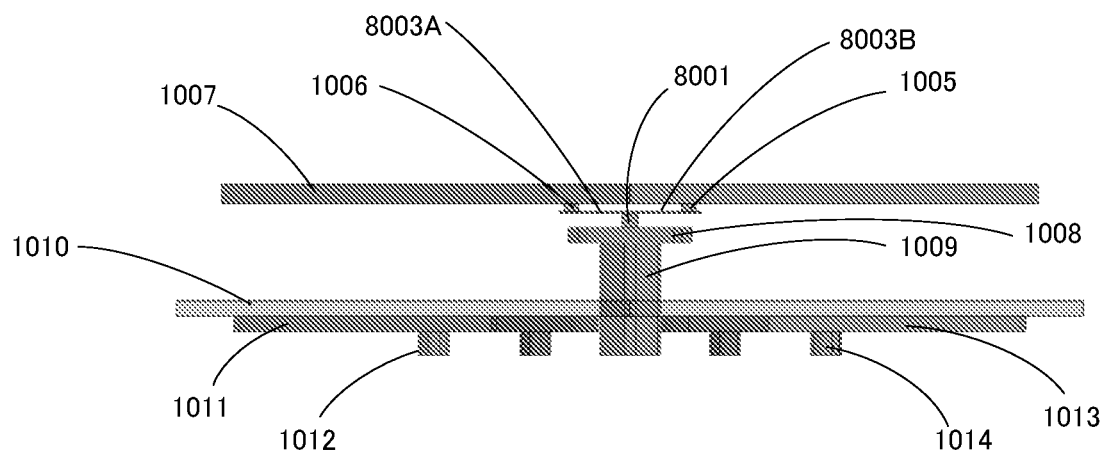
FIG. 9 is a side view of the MEMS device of FIG. 8 in an OFF position.

FIG. 8 is a perspective view of a MEMS device 8000 according to a fourth implementation of the teachings herein, and FIG. 9 is a side view of the MEMS device 8000 in the OFF position. The structure of the MEMS device 8000 is substantially similar to the structure of the MEMS device 1000. The only differences are related to the structure of the hinge. The hinge in the MEMS device 8000 includes a vertical support 8001 from which two hinge tabs 8003A, 8003B radially extend. The vertical support 8001 is a cantilever that extends vertically upwards from a position approximately equidistant between opposing edges of the base (such as the hinge support 1009 or the stopper 1008) in the tilt direction of the mirror 1007. The vertical support 8001 may be centered on the base. The hinge tabs 8003A, 8003B extend along the same radial line away from the vertical support 8001. In this way, the hinge tabs 8003A, 8003B may be referred to as horizontal hinges of the cantilever. Like the hinge tabs 6003A, 6003A, the hinge tabs 8003A, 8003B may also be referred to as duel horizontal tabs herein. The mirror 1007 is secured to the hinge tab 8003A through the mirror via 1006, and the mirror 1007 is secured to the hinge tab 8003B through the mirror via 1005.

The hinge comprising the vertical support 8001 and the hinge tabs 8003A, 8003B are formed similarly to the foot 1002, the vertical support 1001, and the hinge tab 1003. That is, after deposition of the oxide layer 12001, and etching of a hole to the base 12005, a deposition of in-situ doped amorphous silicon occurs (e.g., using CVD). In this case, however, the hole may be smaller in diameter than the hole of the hinges described above such that the entirety of the hole is filled instead of just the side walls. The top surface of the oxide layer 12001 is also covered. Then, a photo-resist layer is coated and patterned by lithography. While the hinge of the MEMS device 1000 is formed by etching-off the three sides of the side walls, the hinge of the MEMS device 8000 may be formed by etching-off two opposing sides of the side walls of the hole. Subsequently, the mirror vias 1005, 1006 and the mirror 1007 may be formed as described above.

The vertical hinge of the MEMS device 8000 may incorporate any of the variations described with regards to FIGS. 12 to 15. That is, for example, because the vertical support 8001 also performs the functions of the foot 1002 (i.e., securing the hinge to the base), the bottom of the vertical support 8001 may be fluted, thickened as compared to the top, rounded, buried in the base, or some combination of these features. This structure for a hinge, and any of its variations, may be incorporated with MEMS devices using different layered arrangements, such as with the MEMS device 4000 of FIGS. 4 and 5.

Figure 10:
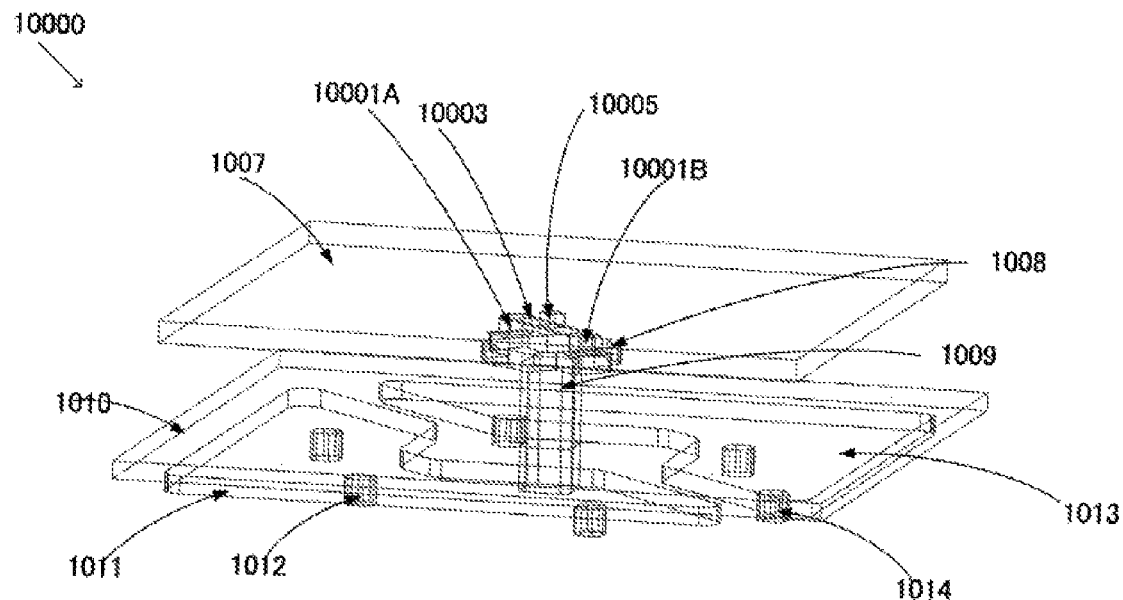
FIG. 10 is a perspective view of a MEMS device according to a fifth implementation of the teachings herein.
Figure 11:
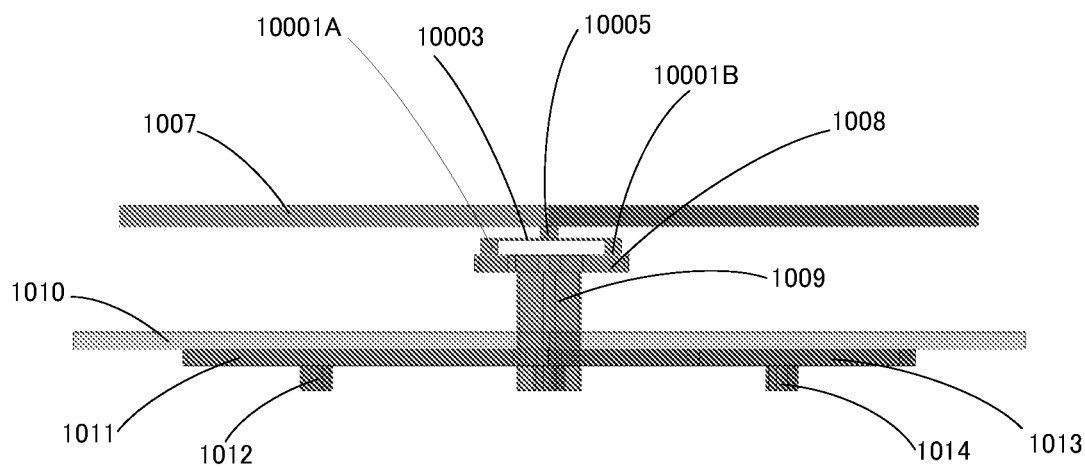
FIG. 11 is a side view of the MEMS device of FIG. 10 in an OFF position.

FIG. 10 is a perspective view of a MEMS device 10000 according to a fifth implementation of the teachings herein, and FIG. 11 is a side view of the MEMS device 10000 in the OFF position. The structure of the MEMS device 10000 is substantially similar to the structure of the MEMS device 1000. The only differences are related to the structure of the hinge. The hinge in the MEMS device 10000 includes vertical supports 10001A, 10001B spaced by a horizontally-extending hinge tab 10003. The vertical supports 10001A, 10000B extend vertically upwards from positions approximately equidistant (e.g., they are equidistantly spaced) from opposing edges of the base (such as the hinge support 1009 or the stopper 1008) in the tilt direction of the mirror 1007.

The mirror 1007 is secured to the hinge tab 10003 through a single mirror via 10005 centered between the vertical supports 10001A, 10001B. The vertical supports 10001A, 10001B have a combination of height and spacing that limit the deformation of the hinge tab 10003 responsive to the electrostatic attraction of the mirror 1007 to the electrode 1013 such that the mirror 1007 does not contact the surface layer of the substrate (here, the etch stop layer 1010). This deformation causes torsion along the horizontal length of the hinge tab 10003. Hence, this hinge may be referred to as a horizontal torsion hinge.

The hinge comprising the vertical support 8001 and the hinge tabs 8003A, 8003B are formed similarly to the foot 1002, the vertical support 1001, and the hinge tab 1003. That is, after deposition of the oxide layer 12001, and etching of a hole to the base 12005, a deposition of in-situ doped amorphous silicon occurs (e.g., using CVD). In this case, however, more than one hole is etched. The holes may be relatively small in diameter as compared to the holes described with regards to the manufacture FIGS. 1 to 3, like the hole described with regards to FIGS. 8 and 9. The entirety of the holes are filled instead of just the side walls. The top surface of the oxide layer 12001 is also covered. Then, a photo-resist layer is coated and patterned by lithography. While the hinge of the MEMS device 1000 is formed by etching-off the three sides of the side walls, the hinge of the MEMS device 8000 may be formed by etching-off two opposing sides of the side walls of the holes extending along the tilt direction. Subsequently, the mirror via 10005 and the mirror 1007 may be formed as described above.

The hinge of the MEMS device 10000 may incorporate any of the variations described with regards to FIGS. 12 to 15. That is, for example, because the vertical supports 10001A, 10001B also perform the functions of the foot 1002 (i.e., securing the hinge to the base), the bottom of the vertical supports 8001 may be fluted, thickened as compared to the top, rounded, buried in the base, or some combination of these features. This structure for a hinge, and any of its variations, may be incorporated with MEMS devices using different layered arrangements, such as with the MEMS device 4000 of FIGS. 4 and 5.

Although the present invention has been described in terms of certain embodiments, it is to be understood that such disclosure is not to be interpreted as limiting. Various alterations and modifications will become apparent to those skilled in the art after reading the disclosure. Accordingly, it is intended that the appended claims be interpreted as covering all alternations and modifications that fall within the scope thereof.

What is claimed is:

1. A Micro-Electro-Mechanical Systems (MEMS) device, comprising:
   a substrate;
   an electronic circuit mounted on the substrate;

an electrode electrically connected to the electronic circuit;
an etch stop layer mounted on the substrate;
a hinge base mounted on the substrate;
a stopper mounted on the hinge base;
a hinge formed on the stopper and made of a doped semiconductor, the hinge comprising:
  a vertical support that extends vertically away from the hinge base;
  a horizontally-extending hinge tab in contact with the vertical support;
  a hinge foot in contact with the hinge base, wherein the hinge base includes a hinge support mounted on the substrate or the stopper mounted on the hinge support, and the hinge foot extends horizontally in a direction opposite from the hinge tab;
  a second vertical support extending in parallel with the vertical support at opposing edges of the hinge foot; and
  a second horizontally-extending hinge tab in contact with the second vertical support and extending in a direction opposite from the hinge tab;
a movable mirror that is electrostatically attracted to the electrode responsive to application of a voltage between the electrode and the movable mirror; and
a mirror via that couples the movable mirror to the hinge tab and a second mirror via that couples the movable mirror to the second hinge tab, wherein movement of the movable mirror changes a relative position between the hinge tab and the vertical support, and the hinge tab is configured to contact the stopper to mechanically stop the movement of the movable mirror before contact with one of the electrode or the etch stop layer.

2. The MEMS device of claim 1, wherein the doped semiconductor is in-situ amorphous silicon.

3. The MEMS device of claim 1, wherein at least one of:
a bottom surface of the hinge foot is below a top surface of the hinge base;
a hinge heel of the hinge foot is curved in a side view where the hinge foot and the vertical support meet; or
the hinge foot is sunk into the stopper.

4. The MEMS device of claim 1, wherein a surface adhesion of the hinge foot to the hinge base exceeds a shear force of the hinge in a vertical direction.

5. The MEMS device of claim 1, wherein a surface tension of the vertical support adjacent to the hinge tab and a surface tension of the vertical support adjacent to the hinge base are different by more than 1%.

6. The MEMS device of claim 1, wherein a contact point of the stopper with the mirror is horizontal and is rounded with a turn radius less than 25% of a longest dimension of the stopper.

7. The MEMS device of claim 6, wherein a side view of the contact point of the stopper with the mirror has a tilt angle of less than 100 degrees.

8. The MEMS device of claim 1, wherein the mirror via has rounded corners with a turn radius of less than 50% of a width of the mirror via.

9. The MEMS device of claim 1, wherein a tilt angle of the mirror after removal of a sacrificial layer is within +/−0.5 degrees by adjusting at least one of a flow rate of silane, a temperature of the substrate, or a pressure inside a CVD chamber.

10. The MEMS device of claim 1, wherein at least one of a width and/or a height of the vertical support is from 100 A to 1000 A, inclusive, or a resistance of the vertical support is from 5 Mohm to 1 Gohm, inclusive.

11. The MEMS device of claim 10, wherein a thermal coefficient of the resistance of the vertical support is negative such that a higher a temperature of the hinge, a lower a resistance of the hinge.

12. The MEMS device of claim 1, wherein a resting angle of the hinge tab relative the vertical support is from 80 to 90 degrees, inclusive, with respect to the substrate.

13. The MEMS device of claim 1, wherein a distance between the stopper and the hinge tab is less than one-half a distance between the vertical support and an edge of the mirror.

14. The MEMS device of claim 1, wherein a height of the hinge tab exceeds a width of the vertical support.

15. The MEMS device of claim 1, wherein the vertical support includes fluting adjacent to the hinge base.

16. The MEMS device of claim 1, wherein the vertical support tapers from a top adjacent the hinge tab to a bottom adjacent the hinge base.

17. The MEMS device of claim 1, wherein the hinge tab has a barrier metal and is devoid of an oxidation layer or a nitride layer.

18. The MEMS device of claim 1, wherein the mirror via comprises at least one material with a Vickers hardness exceeding 500 MPaness.

19. The MEMS device of claim 1, wherein a vertical height of the mirror via is less than 0.5 microns.

20. The MEMS device of claim 1, wherein a distance between the mirror and the etch stop layer is less than 3 microns.

21. The MEMS device of claim 1, wherein the mirror via has a round horizontal shape or a square horizontal shape.

22. A Micro-Electro-Mechanical Systems (MEMS) device, comprising:
a substrate;
an electronic circuit mounted on the substrate;
an electrode electrically connected to the electronic circuit;
an etch stop layer mounted on the substrate;
a hinge base mounted on the substrate;
a hinge mounted on the hinge base, the hinge comprising:
  a vertical support that extends vertically from the hinge base;
  a second vertical support extending in parallel with the vertical support; and
  a horizontally-extending hinge tab in contact with the vertical support, wherein the hinge is made of a doped semiconductor;
a movable mirror that is electrostatically attracted to the electrode responsive to application of a voltage between the electrode and the movable mirror;
a mirror via that couples the movable mirror to the hinge tab, wherein movement of the movable mirror changes a relative position between the hinge tab and the vertical support; and
a stopper mounted on the substrate that mechanically stops the movement of the movable mirror before contact with the electrode or the etch stop layer, wherein:
the vertical support and the second vertical support are equidistantly spaced from a center of the hinge base along a tilt direction of the movable mirror;
the hinge tab extends between a top surface of the vertical support and the second vertical support; and
the mirror via is centered on the hinge tab, such that the hinge is a horizontal torsion hinge.

23. A MEMS device of claim 22, wherein the hinge tab extends equidistantly from a center of the vertical support, and the MEMS device further comprises:
a second mirror via that couples the movable mirror to the hinge tab, wherein the mirror via and the second mirror are equidistantly spaced from a center of the hinge tab in a tilt direction of the mirror, such that the hinge is a cantilever.

24. A Micro-Electro-Mechanical Systems (MEMS) device, comprising:
a substrate;
an electronic circuit mounted on the substrate;
an electrode electrically connected to the electronic circuit;
an etch stop layer mounted on the substrate;
a hinge base mounted on the substrate;
a hinge mounted on the hinge base, the hinge comprising:
a vertical support that extends vertically from the hinge base; and
a horizontally-extending hinge tab in contact with the vertical support, wherein the hinge is made of a doped semiconductor;
a movable mirror that is electrostatically attracted to the electrode responsive to application of a voltage between the electrode and the movable mirror;
a mirror via that couples the movable mirror to the hinge tab, wherein movement of the movable mirror changes a relative position between the hinge tab and the vertical support; and
a stopper mounted on the substrate that mechanically stops the movement of the movable mirror before contact with the electrode or the etch stop layer,
wherein at least one of a surface adhesion of the mirror via to a surface of the hinge tab or a surface adhesion of the mirror via to a surface of the movable mirror exceeds a shear force of the hinge in a vertical direction.

25. The MEMS device of claim 24, wherein the mirror via is encapsulated by barrier metals including Titanium, Titanium Nitride, or a combination thereof, and the mirror via and the mirror are electrically connected by a conductive material enabling electrical resistance between the mirror and the hinge to be less than 10 G ohms.

26. The MEMS device of claim 24, wherein at least one of a width and/or a height of the vertical support is from 100 A to 1000 A, inclusive, or a resistance of the vertical support is from 5 Mohm to 1 Gohm, inclusive.

27. The MEMS device of claim 26, wherein a thermal coefficient of the resistance of the vertical support is negative such that a higher a temperature of the hinge, a lower a resistance of the hinge.

* * * * *